(12) United States Patent
Takahashi et al.

(10) Patent No.: US 6,204,593 B1
(45) Date of Patent: Mar. 20, 2001

(54) RESONATOR AND PIEZOELECTRIC RESONANCE DEVICE WITH GROOVED LEAD TERMINALS THEREOF

(75) Inventors: Touru Takahashi; Yuuichi Sugawara, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/366,282

(22) Filed: Aug. 2, 1999

(30) Foreign Application Priority Data

| Aug. 7, 1998 | (JP) | ................................................ 10-224791 |
| Aug. 7, 1998 | (JP) | ................................................ 10-224792 |
| Sep. 21, 1998 | (JP) | ................................................ 10-267041 |

(51) Int. Cl.$^7$ .............................. H03H 9/02; H03H 9/125
(52) U.S. Cl. ........................ 310/353; 310/340; 310/348; 310/349
(58) Field of Search ..................................... 310/368, 344, 310/340, 348, 349, 353

(56) References Cited

U.S. PATENT DOCUMENTS

| 3,340,410 | * | 9/1967 | Sanford .................................. 310/9.1 |
| 4,810,484 | * | 3/1989 | Uedaira et al. ....................... 423/598 |
| 5,345,136 | * | 9/1994 | Takagi et al. ......................... 310/320 |
| 5,525,855 | * | 6/1996 | Gotoh et al. .......................... 310/344 |
| 5,759,753 | * | 6/1998 | Namba et al. ......................... 438/456 |
| 5,808,397 | * | 9/1998 | Kotani ................................... 310/320 |
| 5,839,178 | * | 11/1998 | Yoshida et al. ...................... 29/25.35 |
| 5,982,076 | * | 7/2000 | Kim et al. ............................. 310/348 |
| 6,087,763 | * | 7/2000 | Kim et al. ............................. 310/348 |

FOREIGN PATENT DOCUMENTS

| 63-131414 | 8/1988 | (JP) | ................................. H03H/9/02 |
| 3-2733 | 1/1991 | (JP) | ................................. H03H/9/02 |
| 3-421 | 1/1991 | (JP) | ................................. H03H/9/02 |
| 5-25821 | 4/1993 | (JP) | ................................. H03H/9/02 |
| 9-181217 | 7/1997 | (JP) | ................................. H01L/23/12 |

* cited by examiner

Primary Examiner—Thomas M. Dougherty
(74) Attorney, Agent, or Firm—Oliff & Berridge, PLC

(57) ABSTRACT

A resonator including a piezoelectric element; a lead terminal comprised of an electroconductive wire material formed by press working with a tapered receiving groove for holding an end of the piezoelectric element at its top end; and a capacitor connected to the outer circumference of the top end of the lead terminal in a state with the end of the piezoelectric element held in the receiving groove of the lead terminal so as to constitute a resonance circuit together with the piezoelectric element. Preferably, a difference of a coefficient of heat expansion of a piezoelectric ceramic constituting the piezoelectric element and a coefficient of heat expansion of a dielectric ceramic constituting the capacitor is not more than 5 ppm/° C. Preferably, the area of the surface of the piezoelectric element contacting a vibrating space is in a predetermined relation with the frequency band of the piezoelectric element.

18 Claims, 6 Drawing Sheets

RESONATOR AND PIEZOELECTRIC RESONANCE DEVICE WITH GROOVED LEAD TERMINALS THEREOF

BACKGROUND OF THE INVENTION

1. Field of the Invention

The present invention relates to a resonator, and a piezoelectric resonance device, and.

2. Description of the Related Art

A resonator, an example of a piezoelectric resonance device, is used in various types of electronic equipment as a circuit for generating clock signals etc. In general, a resonator is provided with a piezoelectric element and a capacitor. These are made to constitute a signal, generating circuit by connection of the input-output lead terminals and the ground lead terminals. The piezoelectric element and capacitor are integrally covered by a sealing resin comprised of an epoxy resin etc.

It is generally known to use an input-output lead terminal for such a resonator. For example, such a lead terminal is disclosed in Japanese unexamined utility Model Publication (Kokai) No. 63-131414. The lead terminal shown in this publication is produced by punching a metal sheet to form a strip which is then cut and bent.

In the lead terminal shown in this publication, there is the problem of a large number of steps required for production. Furthermore, since this lead terminal is structured to hold an end of the piezoelectric element from the two different sides, the area of the vibrating section of the piezoelectric element is reduced and the longitudinal width of the piezoelectric element has to be increased by the amount of the area required for holding the ends. This runs counter to the demands for reducing the size of piezoelectric resonators.

As another lead terminal according to the related art, there is known the lead terminal shown in Japanese Unexamined Patent Publication (Kokai) No. 3-421. The lead terminal shown in this publication is produced by punching a metal sheet to form a T-shape and then bending the ends to form a U-shape.

However, the lead terminal shown in the 3-421 publication requires a large number of steps for production. Additionally, the lead terminal disclosed in the 3-421 publication is structured to hold a piezoelectric element from two sides. Therefore, the area of the vibrating section of the piezoelectric element is reduced. Thus, the longitudinal width of the piezoelectric element must be increased by the amount of the area required for holding the ends of the piezoelectric element. Furthermore, this solution does not allow the size of the piezoelectric resonators to be reduced.

Further, as shown in Japanese Unexamined Patent Publication (Kokai) No. 63-131414, the resonator of the related art had the piezoelectric element and capacitor positioned facing each other substantially in parallel. If such a piezoelectric resonator is used in an environment with severe temperature changes (for example, mounted in an automobile), however, there is the problem of a susceptibility to reduce vibration. To prevent this problem, it has been confirmed that the piezoelectric element and the capacitor can be positioned offset from each other in the vertical direction. The piezoelectric element and the capacitor are then connected and secured by the lead terminals. Once again, this solution does not allow the size of the piezoelectric resonators to be reduced.

Further, in the resonator of the related art, the size of the vibrating space formed in the sealing resin surrounding the area around the piezoelectric element was determined without regard to the frequency band of the piezoelectric element and therefore there was the problem that good resonance characteristics could not be obtained.

SUMMARY OF THE INVENTION

The present invention was made in consideration of this situation. A first object of the present invention is to provide a resonator that is easy to produce and can be made smaller in size and a method for production of the same.

A second object of the present invention is to provide a resonator which is superior in resistance to thermal shock and can be made smaller in size.

A third object of the present invention is to provide a resonator or other piezoelectric resonance device that maintains the resonance characteristics well and is superior in durability and a method for production of the same.

To achieve the first object, according to a first aspect of the present invention, there is provided a resonator comprising a piezoelectric element; a lead terminal comprised of an electroconductive wire material formed by press working with a tapered receiving groove for holding an end of the piezoelectric element at its top end; and a capacitor connected to the outer circumference of the top end of the lead terminal in a state with the end of the piezoelectric element held in the receiving groove of the lead terminal so as to constitute a resonance circuit together with the piezoelectric element.

The method of production of the piezoelectric resonator according to the first aspect of the present invention comprises the steps of forming a tapered receiving groove at an end of the lead terminal comprised of the electroconductive wire material by press working; inserting an end of the piezoelectric element inside the tapered receiving groove and making the piezoelectric element be held by the lead terminal; and connecting an external electrode of a capacitor constituting a resonance circuit together with the piezoelectric element to the lead terminal.

With the resonator according to the first aspect of the present invention since the tapered receiving groove is formed at the end of the electroconductive wire material by press working, the production of the lead terminal becomes extremely easy. Further, since the tapered receiving groove formed in the lead terminal holds an end of the piezoelectric element by the minimum necessary area, reduction of the size of the piezoelectric resonator becomes easy.

Preferably, the tapered receiving groove has an open portion of a width in the cross-section larger than the thickness of the end of the piezoelectric element and a bottom wall of a width in the cross-section smaller than the thickness of the end of the piezoelectric element. By making such a tapered receiving groove, even ends of piezoelectric elements somewhat different in thickness can be held in the tapered receiving groove and therefore it is possible to use the lead terminal parts universally.

Preferably, the cross-sectional shape of the wire material constituting the lead terminal is substantially circular at the portion not formed with the tapered receiving groove. A wire material of a substantially circular cross-section is easy to obtain and contributes to the reduction of the manufacturing costs.

Preferably, the tapered receiving groove is formed at the top end of the lead terminal at a length of at least the width of the piezoelectric element along the longitudinal direction of the lead terminal.

Preferably, a bent portion is formed in the midway of the lead terminal in the longitudinal direction. The bent portion of the lead terminal acts as a stopper when inserting the lead terminal into a mounting hole of the circuit board and enables the height of the piezoelectric element and capacitor from the circuit board to be made constant and thereby contributes to the stabilization of the characteristics of the piezoelectric resonator.

Preferably, an external electrode formed at the surface of the piezoelectric element is electrically connected to the lead terminal through solder in the receiving groove. Solder paste is inserted in the receiving groove, then the end of the piezoelectric element is inserted into the receiving groove and heat treatment is applied, whereby the end of the piezoelectric element and lead terminal are secured and the external terminal of the piezoelectric element and lead terminal are electrically connected simultaneously.

To achieve the second object, according to a second aspect of the present invention, there is provided a resonator comprising a piezoelectric element; a lead terminal comprised of an electroconductive wire material for holding an end of the piezoelectric element; and a capacitor connected to the top end of the lead terminal in a state with the end of the piezoelectric element held by the lead terminal so as to constitute a resonance circuit together with the piezoelectric element, wherein a difference of a coefficient of heat expansion of a piezoelectric ceramic constituting the piezoelectric element and a coefficient of heat expansion of a dielectric ceramic constituting the capacitor is not more than 5 ppm/° C.

Preferably, the piezoelectric ceramic is a three-component based zirconia-lead titanate-based ceramic and the dielectric ceramic is a lead-based ceramic.

In the piezoelectric resonator according to the second aspect of the present invention, since the difference of the coefficient of heat expansion of the piezoelectric ceramic constituting the piezoelectric element and the coefficient of heat expansion of the dielectric ceramic constituting the capacitor is not more than 5 ppm/° C., this contributes to the reduction in size of the piezoelectric resonator and improves the resistance to thermal shock of the resonator. That is, by arranging the piezoelectric element and the capacitor in parallel, it is possible to reduce the size of the resonator. Further, even if the resonator is placed in a location with sharp temperature changes, since the difference in heat expansion between the piezoelectric element and the capacitor is small, there is little fear of occurrence of cracks etc. and the durability is excellent.

Note that in the present invention the value of the coefficient of heat expansion (also called the coefficient of linear expansion) is judged by the value under an environment of −40° C. to +85° C.

To achieve the third object, according to a third aspect of the present invention, there is provided a piezoelectric resonance device comprising a piezoelectric element and a sealing resin portion for covering the piezoelectric element so that a vibrating space is formed around a vibrating section of the piezoelectric element, wherein the surface area of the piezoelectric element contacting the vibrating space is in a predetermined relation with the frequency band of the piezoelectric element.

The method of production of the piezoelectric resonance device according to the third aspect of the present invention comprises the steps of coating a wax at a predetermined location of a piezoelectric element using a trowel having a trowel tip width selected in accordance with a frequency band of the piezoelectric element, covering with a sealing resin the entirety of the piezoelectric element coated with the wax, and heating the sealing resin to cure the sealing resin and making the wax be absorbed in the sealing resin to form a vibrating space in the sealing resin.

Preferably, when the frequency band of the piezoelectric element is 3 MHz, the area of the surface of the piezoelectric element contacting the vibrating space is $3.0±0.4$ mm$^2$. Further, when the frequency band of the piezoelectric element is 4 MHz, the area of the surface of the piezoelectric element contacting the vibrating space is preferably $2.7±0.4$ mm$^2$. Further, when the frequency band of the piezoelectric element is 5 to 6 MHz, the area of the surface of the piezoelectric element contacting the vibrating space is preferably $2.4±0.4$ mm$^2$.

In the piezoelectric resonance device and method of production thereof of the above aspect of the present invention, by setting the area of the surface of the piezoelectric element in contact with the vibrating space to a predetermined relationship with the frequency band of the piezoelectric element, it becomes possible to hold the resonance characteristics of the piezoelectric element well and becomes possible to effectively prevent cracks, damages, etc. of the piezoelectric element and/or sealing resin. Further, in the method of production of a piezoelectric resonance device according to the present invention, it is possible to efficiently produce a piezoelectric resonator with good resonance characteristics and superior durability.

Note that the piezoelectric resonance device according to the above aspect of the present invention is not limited to a resonator and includes all devices having vibrating spaces such as a piezoelectric resonance filter.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

First Embodiment

Figure 1A:
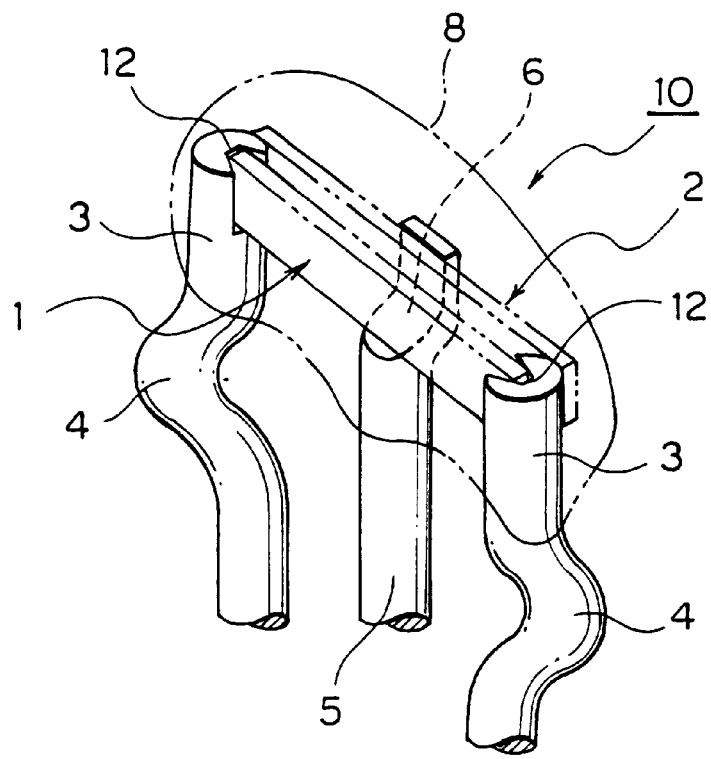
FIG. 1A is a schematic perspective view of key parts of a resonator according to an embodiment of the present invention.
Figure 1B:
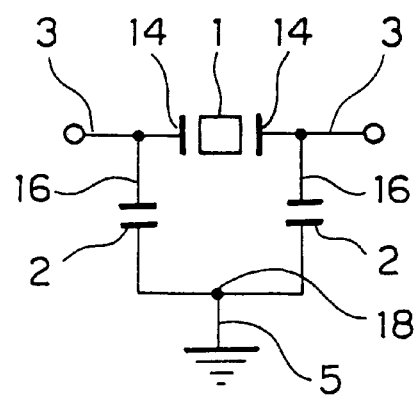
FIG. 1B is an equivalent circuit diagram of the resonator shown in FIG. 1A.

As shown in FIG. 1A, the resonator 10 according to this embodiment is comprised of a piezoelectric element 1 and a capacitor 2 arranged substantially in parallel. The piezoelectric element 1 and the capacitor 2, as shown in FIG. 1B, are connected with a pair of input-output lead terminals 3 and a single ground lead terminal 5 so as to comprise for example a signal generation circuit of an integrated circuit.

Figure 2:
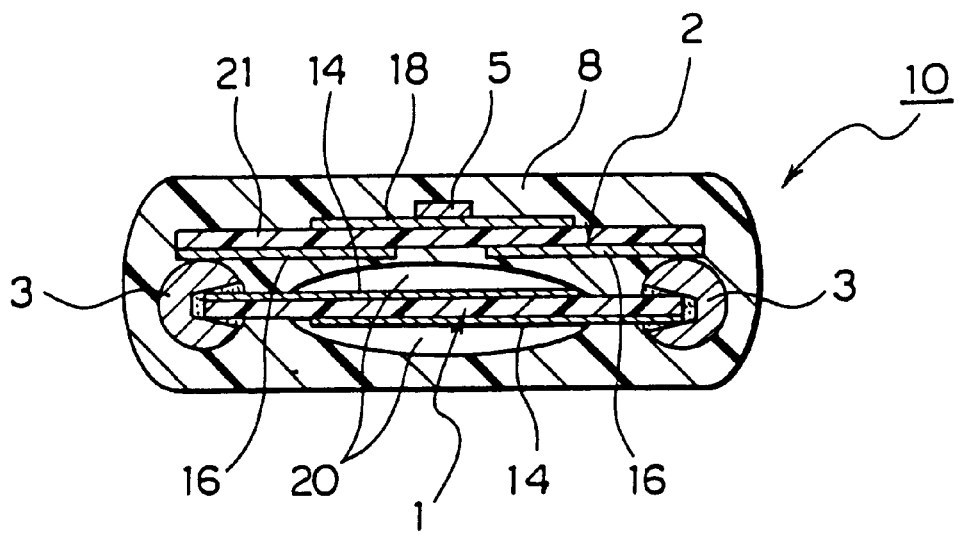
FIG. 2 is a schematic sectional view of the piezoelectric resonator shown in FIG. 1A.

As shown in FIG. 1A and FIG. 2, the piezoelectric element 1, the capacitor 2, and the outer circumferences of the top ends of the lead terminals 3 and 5 are covered by a sealing resin 8. A vibrating space 20 is formed around the vibrating section of the piezoelectric element 1. The sealing resin 8 is not particularly limited, but for example is comprised of an epoxy-based resin etc.

In the pair of input-output lead terminals 3 in the longitudinal direction (positions projecting out from sealing resin 8) are formed substantially U-shaped bent portions 4 bulging outward. The bent portions 4 of the lead terminals 3 act as stoppers when inserting the bottom ends of the lead terminals 3 into the mounting holes of a circuit board (not shown). They enable the heights of the piezoelectric element and capacitor from the circuit board to be kept constant and contribute to the stabilization of the characteristics of the piezoelectric resonator 10.

The top end of the ground lead terminal 5 is formed with a step portion 6. The center of the capacitor 2 is held on the step portion 6. The step portion 6 is buried in the sealing resin 8. The ground lead terminal 5 is not particularly limited, but for example is comprised of a round conductor or other metal wire.

Figure 3:
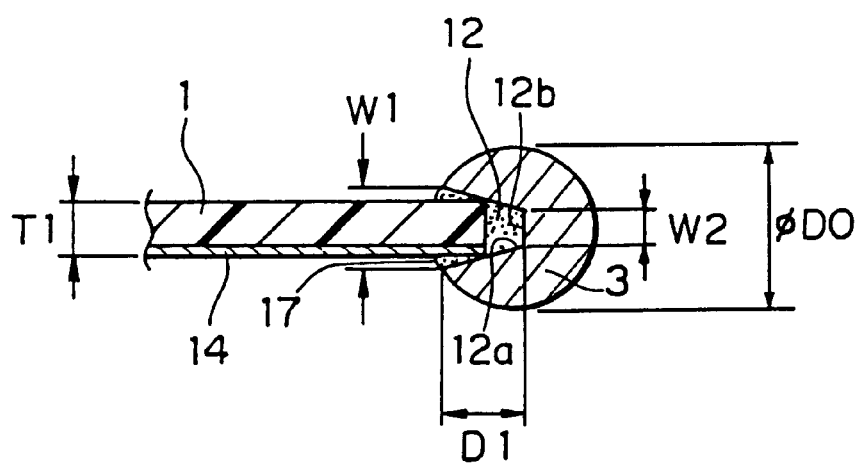
FIG. 3 is a sectional view of key parts showing in detail the connecting portion between a piezoelectric element and a lead terminal of the resonator shown in FIG. 1A.
Figure 5:
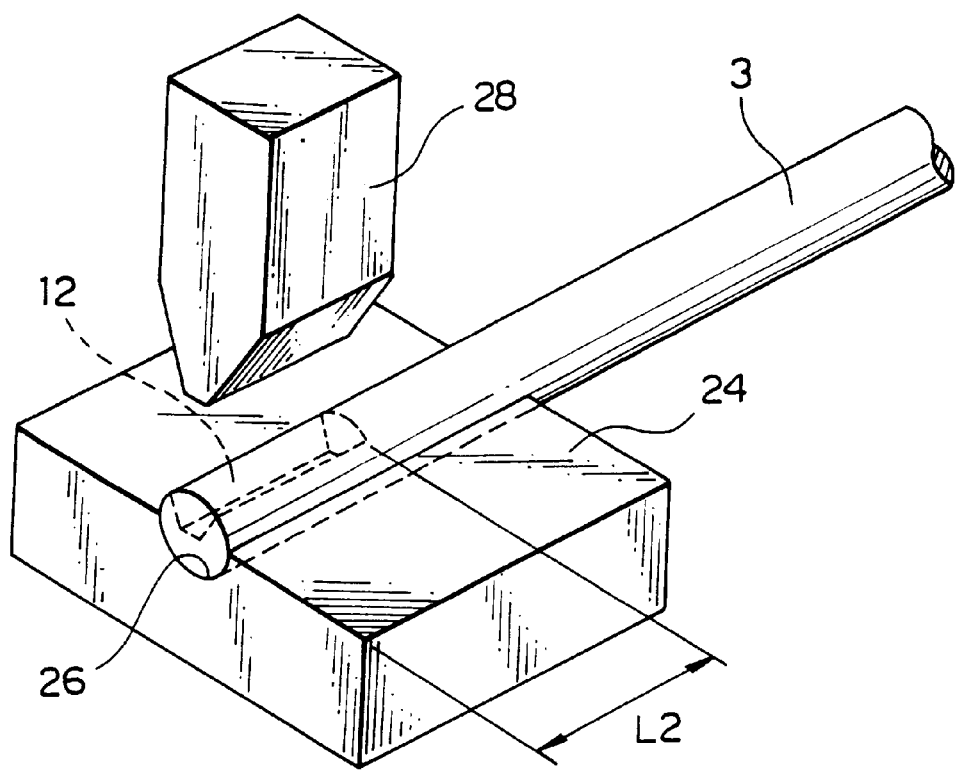
FIG. 5 is a perspective view of key parts showing the process of production of the lead terminal.

Each of the input-output lead terminals 3 is comprised for example of a circular-section electroconductive wire material. As shown in FIG. 1A and FIG. 3, each is formed at its top end with a tapered receiving groove 12. In the present embodiment, the tapered receiving groove 12 is formed by "thrust forming"—a kind of press working. That is, as shown in FIG. 5, an end of the rod wire material to form the lead terminal 3 is placed in a semicircular-section groove 26 formed in a base 24 and pressed against by the front end of a hard metal die 28 from above the wire material by a hydraulic press mechanism etc. so as to form the tapered receiving groove 12. Note that the wire material forming the input-output lead terminal is comprised of a metal similar to the material of the ground lead terminal 5.

Figure 4:
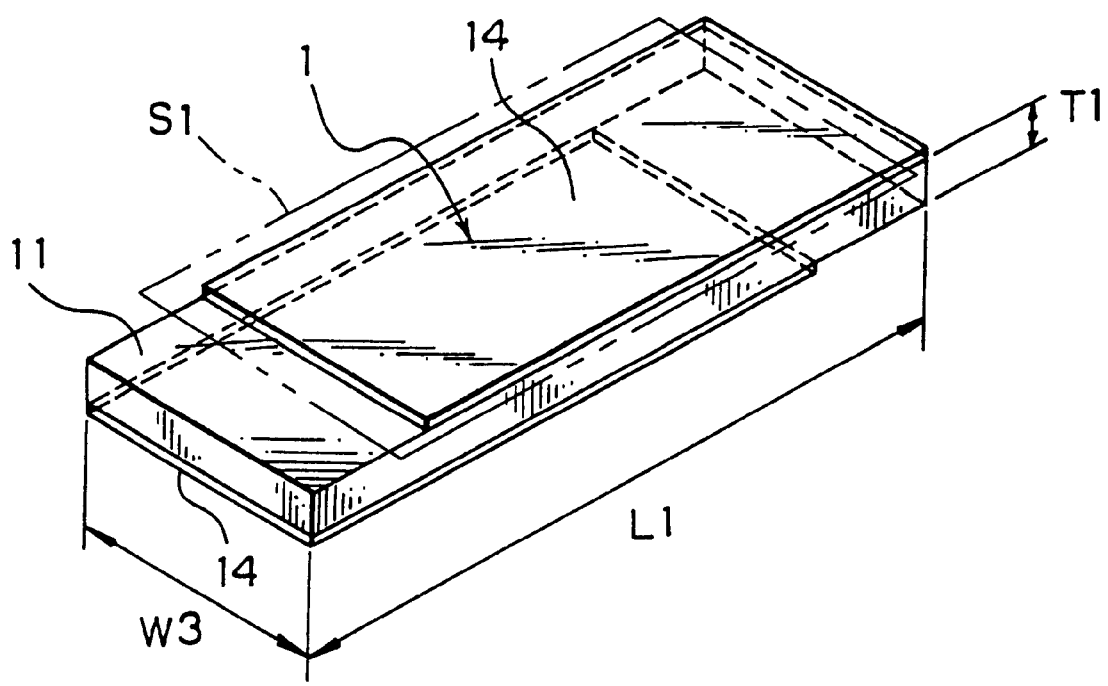
FIG. 4 is a schematic perspective view of the piezoelectric element.

As shown in FIG. 3, the tapered receiving groove 12 has a pair of inclined side walls 12a and a bottom 12b. The cross-sectional width W1 of the opening portion of the groove 12 is larger than the thickness T1 of the piezoelectric element 1, while the cross-sectional width W2 of the bottom 12b is smaller than the thickness T1 of the piezoelectric element 1. The thickness T1 of the present invention is determined in accordance with the oscillating frequency, but in general is 0.25 to 0.39 mm or so. The width W3 of the piezoelectric element 1 shown in FIG. 4 is generally 0.5 to 0.7 mm or so. Further, the length Li of the piezoelectric element 1 is 6.0 to 6.5 mm or so.

As shown in FIG. 3, the cross-sectional width W1 of the opening of the groove 12 is preferably a dimension of about 150 to 200 percent of the thickness T1 of the piezoelectric element 1, while the cross-sectional width W3 of the bottom 12b of the groove 12 is preferably a dimension of 0 to 80 percent or so of the thickness T1. Further, the depth D1 of the groove 12 is preferably a dimension of about 40 to 60 percent of the outer diameter D0 of the wire material constituting the lead terminal 3. The outer diameter D0 of the wire material constituting the lead terminal 3 is determined in accordance with the inside diameter of the terminal mounting holes of a printed circuit board etc.

The groove 12, as shown in FIG. 5, is formed along the longitudinal direction of the wire material constituting the lead terminal 3. The length L2 is a length of at least the width W3 of the piezoelectric element 1 shown in FIG. 4. Preferably, it is a dimension of 100 to 150 percent of the width W3.

As shown in FIG. 4, the piezoelectric element 1 has a flat piezoelectric substrate 11. The piezoelectric substrate 11 is comprised of zirconia-lead titanate, lead titanate, etc. External electrodes 14 are formed at the two sides of the substrate 11. One electrode 14 extends to one end of the element 1 in the longitudinal direction, while the other electrode 14 extends to the other end of the element 1 in the longitudinal direction. By applying a predetermined voltage across the electrodes 14, the overlapping portions of the electrodes 14 at the element 1 vibrate. To allow vibration of the overlapping portions of the electrodes 14 at the piezoelectric element 1, a vibrating space 20 is formed inside the sealing resin 8 so that the vibrating space 20 contacts the two surfaces of the piezoelectric element 1 as shown in FIG. 2 by an area S1 larger than the overlapping portions.

The capacitor 2 is structured by a dielectric substrate formed with electrodes at its two surfaces. As shown in FIG. 2, one surface of the dielectric substrate 21 is formed with a pair of first external electrodes 16 at its two ends. The other surface of the substrate 21 is formed with a second external electrode 18. The first external electrodes 16 are electrically connected to the outer circumferences of the top ends of the input-output lead terminals 3, while the second external electrode 18 is connected to the top end of the ground lead terminal 5.

The dielectric substrate 21 of the capacitor 2 is comprised of a dielectric material such as barium titanate, zirconia-lead titanate, etc.

Next, an explanation will be given of the method of production of the piezoelectric resonator 1A shown in FIG. 1A.

First, as shown in FIG. 5, a rod wire material for forming the input-output lead terminals 3 is prepared. A tapered receiving groove 12 is formed by thrust forming at the front end thereof. Next, a bent portion 4 is formed in the midway of the wire material as necessary. Next, the front end of the wire material formed with the tapered receiving groove 12 is dipped in a solder paste to fill the inside of the receiving groove 12 with the solder paste. Next, as shown in FIG. 3, an end of the piezoelectric element 1 is inserted inside the receiving groove 12, whereby the end corners of the piezoelectric element 1 abut against the inclined side walls 12a of the groove 12 and the end of the piezoelectric element 1 is reliably temporary secured by the receiving groove 3 of the lead terminal 3. Further, by a later step of heat treatment for reflow of the solder, the external terminal 14 of the piezoelectric element 1 is firmly electrically connected to the lead terminal 3 by the solder 17 inside the receiving groove 12.

Figure 6A:
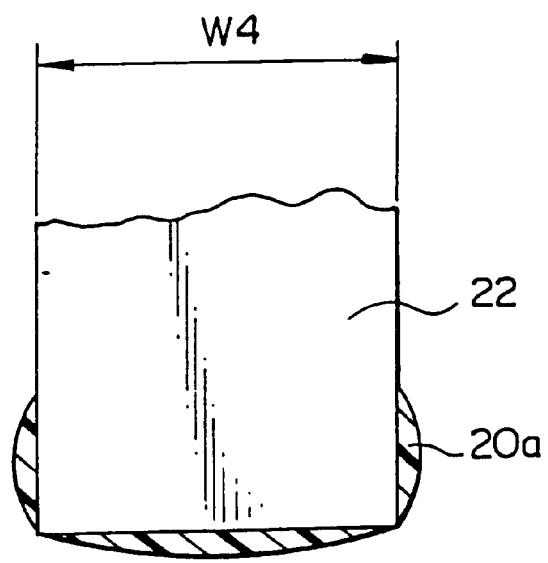
FIG. 6a is a schematic view of the process of production of the resonator to coat a wax on one surface of the piezoelectric element.
Figure 6B:
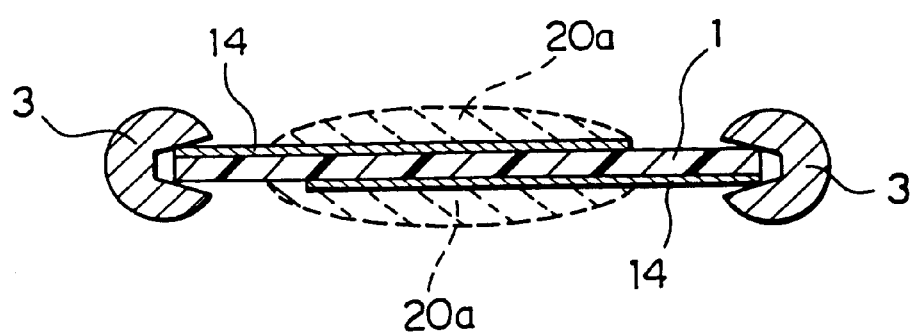
FIG. 6b shows the wax on one surface of the piezoelectric element.

After the two ends of the piezoelectric element 1 are temporarily held by the pair of lead terminals 3, as shown in FIG. 6, a trowel 22 is used to coat a wax 20a on one surface of the piezoelectric element 1. The wax 20a is not particularly limited so long as it is one which is absorbed inside the sealing resin by a later step of heat treatment, but a paraffin-based wax etc. may be used.

Next, the pair of first external electrodes 16 formed at the capacitor 2, to which the ground lead terminal 5 has already been mounted to the second external electrode 18 by a separate step, are connected to the outer circumferences of the input-output lead terminals 3 to position the capacitor 2 and the piezoelectric element 1 substantially in parallel. Next, heat treatment for reflow of the solder is performed to make the mechanical connection and electrical connection of the lead terminals 3 and 5 and the external terminals 14, 16, and 18 more reliable.

Next, the entirety of the piezoelectric element 1, the capacitor 2, and the top ends of the lead terminals 3 and 5 are dipped in molten resin. This is then heat treated to cause it to thermally cure and thereby form the sealing resin 8. At the time of heat treatment of the resin, the wax 20a shown in FIG. 6 is absorbed in the resin 8 and, as shown in FIG. 2, a vibrating space 20 is formed.

In the piezoelectric resonator 10 and method of production thereof according to this embodiment, since the tapered receiving grooves 12 are formed by press working at the ends of the electroconductive wire materials, the production of the lead terminals 3 becomes extremely easy. Further, since the tapered receiving grooves 12 formed at the lead terminals 3 hold the ends of the piezoelectric element 1 by the minimum necessary area, the effective vibrating area of the piezoelectric element 1 is not reduced and reduction of the size of the piezoelectric resonator 10 becomes easy.

Second Embodiment

The piezoelectric resonator according to this embodiment is the same in structure as the piezoelectric resonator 10 shown in FIG. 1A and FIG. 2, but differs in the point that the ceramic materials are selected so that the difference between a coefficient of heat expansion of a piezoelectric ceramic constituting the piezoelectric substrate 11 of the piezoelectric element 1 and a coefficient of heat expansion of a dielectric ceramic constituting the dielectric substrate 21 of the capacitor 2 is not more than 5 ppm/° C.

In this embodiment, the piezoelectric ceramic constituting the piezoelectric substrate 11 of the piezoelectric element 1 is comprised of a three-component based zirconia-lead titanate expressed by $PbTiO_3$—$PbZrO_3$—$Pb(Mg_{1/3}Nb_{2/3})O_3$ and has a coefficient of linear expansion of about 0.2 to 0.8 ppm/° C., preferably 0.5 ppm/° C. Further, the dielectric ceramic constituting the dielectric substrate 21 of the capacitor 2 is comprised of a lead-based dielectric ceramic comprised mainly of $Pb(Mg,Nb)O_3$, $Pb(Fe,Nb)O_3$, $Pb(Zn,Nb)O_3$, $Pb(Mn,Nb)O_3$, etc. or combinations of the same and has a coefficient of linear expansion of about 2.5 to 5.5 ppm/° C., preferably 3.0 to 4.9 ppm/° C. Note that the coefficient of linear expansion in the present invention is the value in an ambient environment of a range of −40° C. to +85° C.

In the resonator according to this embodiment, since the difference between the coefficient of heat expansion of the piezoelectric ceramic constituting the piezoelectric substrate 11 of the piezoelectric element 1 and the coefficient of heat expansion of the dielectric ceramic constituting the dielectric substrate 21 of the capacitor 2 is not more than 5 ppm/° C., this contributes to the reduction of size of the piezoelectric resonator 10 and improves the resistance to thermal shock of the piezoelectric resonator 10. That is, by arranging the piezoelectric element 1 and the capacitor 2 in parallel, it is possible to reduce the size of the piezoelectric resonator. Further, even if the piezoelectric resonator 10 is placed in a location with sharp temperature changes such as in an automobile, since the difference in coefficients of heat expansion of the piezoelectric element 1 and the capacitor 2 is small, there is little fear of cracks or the like being caused in the elements 1 and 2 or sealing resin 8 and the durability is superior.

Figure 7:
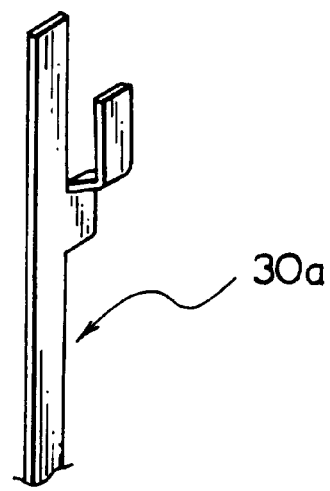
FIG. 7 and FIG. 8 are perspective views of lead terminals used for piezoelectric resonators according to other embodiments of the present invention.
Figure 8:
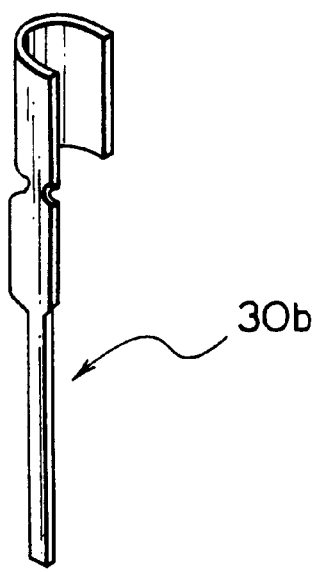

Note that in the piezoelectric resonator according to this embodiment, instead of the input-output lead terminals 3 shown in FIG. 1A, it is also possible to use the general lead terminals 30a or 30b shown in FIG. 7 or FIG. 8.

Third Embodiment

The piezoelectric resonator of an example of the piezoelectric resonance device according to this embodiment is structured the same as the piezoelectric resonator 10 shown in FIG. 1A and FIG. 2, but differs in the point that the area S1 (see FIG. 4) of the surface of the piezoelectric element 1 within the vibrating space 20 is in a predetermined relation with the frequency band of the piezoelectric element 1.

That is, when the frequency band of the piezoelectric element 1 is 3 MHz, the area S1 of the surface of the piezoelectric element 1 within the vibrating space 20 is made 3.0±0.4 $mm^2$, when the frequency band of the piezoelectric element 1 is 4 MHz, the area S1 of the surface of the piezoelectric element 1 within the vibrating space 20 is made 2.7±0.4 $mm^2$, and when the frequency band of the piezoelectric element 1 is 5 to 6 MHz, the area S1 of the surface of the piezoelectric element 1 within the vibrating space 20 is made 2.4±0.4 $mm^2$. In the case of other frequency bands, the area is found by extrapolation or interpolation from the relationship of these frequency bands and areas S1.

When the frequency band of the piezoelectric element 1 becomes higher, the wavelength λ of the frequency becomes shorter. When the wavelength becomes shorter, the thickness of the piezoelectric element 1 also has to be made smaller. According to experiments of the present inventors, it was learned that by reducing the area S1 (see FIG. 4) of the surface of the piezoelectric element 1 within the vibrating space 20 as the frequency of the piezoelectric element 1 becomes higher, it is possible to suppress cracks in the piezoelectric substrate 11 of the piezoelectric element 1 and/or sealing resin without impairing the resonance characteristics.

The area S1 of the surface of the piezoelectric element 1 within the vibrating space 20 is proportional to the trowel tip width W4 of the trowel 22 shown in FIG. 6, so in this embodiment, a trowel having a trowel tip width W4 selected in accordance with the frequency band of the piezoelectric element 1 is used to coat a wax 20a on the two surfaces of the piezoelectric element 1. The area coated by the wax 20a corresponds to the area S1 of the surface of the piezoelectric element 1 within the vibrating space 20 shown in FIG. 4. The maximum coated thickness of the wax 20a corresponds to the maximum thickness at the vibrating space 20. The maximum coated thickness is not related with the frequency band of the piezoelectric element 1. If too thick, the minimum thickness of the sealing resin becomes small, so this is not preferred. Preferably the thickness is 0.35 to 0.45 mm or so.

As to the relationship between the frequency band of the piezoelectric element 1 and the trowel tip width W4, when the frequency band of the piezoelectric element 1 is 3 MHz, the trowel tip width W4 is made 4.5±0.5 mm, when the frequency band of the piezoelectric element 1 is 4 MHz, the trowel tip width W4 is made 4.0±0.5 mm, and when the frequency band of the piezoelectric element 1 is 5 to 6 MHz, the trowel tip width W4 is made 3.5±0.5 mm.

In the piezoelectric resonator and method of production thereof according to the present embodiment, by setting the area S1 of the surface of the piezoelectric element contacting the vibrating space 20 in a predetermined relation with the frequency band of the piezoelectric element 1, it becomes possible to hold the resonance characteristics of the piezoelectric element 1 well and possible to effectively prevent cracks and damages on the piezoelectric element 1 and/or sealing resin 8. Further, with the method of production of a piezoelectric resonator according to this embodiment, it is possible to efficiently produce a piezoelectric resonator having excellent resonance characteristics and superior durability.

Note that in the piezoelectric resonator according to this embodiment, instead of the input-output lead terminals 3 shown in FIG. 3A, it is also possible to use the general lead terminals 30a or 30b shown in FIG. 7 or FIG. 8.

Note that the present invention is not limited to the above embodiments and may be modified in various ways without the scope of the present invention.

Below, the present invention will be explained with reference to detailed examples, but the present invention is not limited to these examples in any way.

EXAMPLE 1

First, a piezoelectric element 1 was prepared. The piezoelectric substrate 11 of the piezoelectric element 1 was comprised of a three-component based zirconia-lead titanate based piezoelectric ceramic of a chemical composition of the main component of $PbTiO_3$—$PbZrO_3$—$Pb(Mg_{1/3}Nb_{2/3})O_3$ and had a coefficient of linear expansion of 0.5 ppm/° C. The width of the piezoelectric substrate 11 was 0.65 mm, the length was 6.5 mm, and the thickness was 0.313 mm. The material of the external electrodes 14 formed at the two surfaces of the piezoelectric substrate 11 was Ni+Cu.

Next, a capacitor 2 was prepared. The dielectric substrate 21 of the capacitor 2 was comprised of a lead-based dielectric ceramic of a chemical composition of the main ingredient of $Pb(Mg_{1/3}Nb_{2/3})O_3$—$PbTiO_3$ and had a coefficient of linear expansion of 4.9 ppm/° C. The width of the dielectric substrate 21 was 0.6 mm, the length was 7.0 mm, and the thickness was 0.35 mm. The material of the external electrodes 16 and 18 formed at the two surfaces of the dielectric substrate 21 was Ni+Cu. The difference of the coefficients of linear expansion of the dielectric substrate 21 and the piezoelectric substrate 11 was 4.4 ppm/° C.

The two ends of the piezoelectric substrate 1 were held by the pair of lead terminals 30b shown in FIG. 8 and the two surfaces of the piezoelectric element 1 were coated with a paraffin-based wax 20a using the trowel 22 shown in FIG. 6. The area S1 (see FIG. 4) coated with the wax 20a was 4.3 mm$^2$.

Next, the capacitor 2 was positioned substantially parallel with respect to the piezoelectric element 1 and the external electrodes 16 of the capacitor 2 were soldered to the lead terminals 30b. Further, the top end of the lead terminal 5 shown in FIG. 1A was soldered to the external electrode 18 of the capacitor 2. Next, the entirety of the piezoelectric element 1 and capacitor 2 was dipped in molten epoxy resin and the resin was heated to cause it to cure and thereby obtain the sealing resin 8. At the time of heating and curing the resin, the wax 20a was absorbed in the resin and a vibrating space 20 thereby formed in the sealing resin.

Twenty of these piezoelectric resonators were fabricated and subjected to heat cycle tests (thermal shock tests). The heat cycle tests consisted of 10 cycles, 50 cycles, 100 cycles, and 200 cycles of a cycle of holding a state of −55° C. for 30±3 minutes, then holding a state of +125° C. for 30±3 minutes, then finding the rate of occurrence of defects of the piezoelectric resonators. Defects were judged by visually determined if there were cracks in the piezoelectric elements or sealing resin. The defect rate (%) was calculated by how many piezoelectric resonators defects occurred in among the 20 piezoelectric resonators.

The results are shown in Table 1. As shown in Table 1, the defect rate of the example 1 was 0 percent in all of the heat cycle tests.

TABLE 1

| | Coefficient of linear expansion (× 10$^{-6}$) | | | Results of thermal shock test (defect rate %) | | | |
|---|---|---|---|---|---|---|---|
| | Piezoelectric element (A) | Capacitor (B) | B − A | Cycle 10 | Cycle 50 | Cycle 100 | Cycle 200 |
| Comp. Ex. 1 | 0.5 | 13.0 | 12.5 | 0 | 5 | 25 | 35 |
| Comp. Ex. 2 | 0.5 | 8.0 | 7.5 | 0 | 0 | 5 | 10 |
| Ex. 1 | 0.5 | 4.9 | 4.4 | 0 | 0 | 0 | 0 |
| Ex. 2 | 0.5 | 3.0 | 2.5 | 0 | 0 | 0 | 0 |

EXAMPLE 2

The same procedure was followed as in Example 1 to fabricate 20 piezoelectric resonators. In Example 2, the main component of the dielectric substrate of the capacitor 2 was the same as the lead-based dielectric ceramic of Example 1. However, in Example 2, the coefficient of linear expansion of the dielectric substrate 21 was 2.5 ppm/° C. Once the piezoelectric resonators were fabricated, the 20 piezoelectric resonators were subjected to heat cycle tests as outlined in Example 1.

The results are shown in Table 1. As shown in Table 1, the defect rate of the example 2 was 0 percent in all of the heat cycle tests.

COMPARATIVE EXAMPLE 1

In Comparative Example 1, the procedure outlined in Example 1 was used to fabricate 20 piezoelectric resonators. However, in Comparative Example 1, the main component of the dielectric substrate 21 of the capacitor 2 was $BaTiO_3$ and the coefficient of linear expansion was 13.0 ppm/° C. Once the piezoelectric resonators were fabricated, the piezoelectric resonators were subjected to heat cycle tests as outlined in Example 1.

The results of the comparative example 1 are shown in Table 1. As shown in Table 1, defects were observed in the 50 cycle and higher heat cycle tests.

COMPARATIVE EXAMPLE 2

In Comparative Example 2, the procedure outlined in Comparative Example 1 was used to fabricate 20 piezoelectric resonators. However, in Comparative Example 2, the main component of the dielectric substrate 21 of the capacitor 2 was $BaTiO_3$ with a coefficient of linear expansion of 8.0 ppm/° C.

The results of the comparative example 2 are shown in Table 1. As shown in Table 1, defects were observed in the 100 cycle and higher heat cycle tests.

Evaluation 1 As shown in Table 1, by comparing Examples 1 and 2 with Comparative Examples 1 and 2, it was confirmed that the resistance to thermal shock was improved in the range of a difference of coefficients of linear expansion of the dielectric substrate 21 and piezoelectric substrate 11 of not more than 5 ppm/° C.

EXAMPLE 3

First, a piezoelectric element 1 was prepared. The piezoelectric substrate 11 of the piezoelectric element 1 was comprised of a three-component-based zirconia-lead titanate-based piezoelectric ceramic of a chemical composition of the main component of $PbTiO_3$—$PbZrO_3$—$Pb(Mg_{1/3}Nb_{2/3})O_3$. The width of the piezoelectric substrate 11 was 0.65 mm, the length was 6.5 mm, and the thickness was 0.35 mm. The material of the external electrodes 14 formed at the two surfaces of the piezoelectric substrate 11 was Ni+Cu. The areas of the external electrodes 14 were 2.56 $mm^2$. Further, the area of the overlapping portions of the external electrodes 14 formed at the two surfaces of the piezoelectric substrate 11 was 1.36 $mm^2$.

Next, a capacitor 2 was prepared. The dielectric substrate 21 of the capacitor 2 was comprised of a lead-based dielectric ceramic of a chemical composition of the main ingredient of $Pb(Mg_{1/3}Nb_{2/3})O_3$ —$PbTiO_3$. The width of the dielectric substrate 21 was 0.6 mm, the length was 7.0 m, and the thickness was 0.35 mm. The material of the external electrodes 16 and 18 formed at the two surfaces of the dielectric substrate 21 was Ni+Cu. The capacity between the external electrodes 16, 16 of the capacitor 2 was set to 15 pF.

The two ends of the piezoelectric substrate 1 were held by the pair of lead terminals 30b shown in FIG. 8 and the two surfaces of the piezoelectric element 1 were coated with a paraffin-based wax 20a using the trowel 22 shown in FIG. 6. The trowel tip width W4 of the trowel 22 was 4.0 mm. The area S1 (see FIG. 4) coated with the wax 20a was 2.7 $mm^2$ on one side.

Next, the capacitor 2 was positioned substantially parallel with respect to the piezoelectric element 1 and the external electrodes 16 of the capacitor 2 were soldered to the lead terminals 30b. Further, the top end of the lead terminal 5 shown in FIG. 1A was soldered to the external electrode 18 of the capacitor 2. Next, the entirety of the piezoelectric element 1 and capacitor 2 was dipped in molten epoxy resin and the resin was heated to cause it to cure and thereby obtain the sealing resin 8. At the time of heating and curing the resin, the wax 20a was absorbed in the resin and a vibrating space 20 thereby formed in the sealing resin.

Two hundreds of these piezoelectric resonators were fabricated and investigated as to rates of occurrence of defects. Resonators where the desired resonance frequency characteristic (within 3 MHz±15 kHz) could not be obtained and resonators where waveform distortion caused by changes in the ambient temperature were observed when measuring the impedance characteristic of the piezoelectric resonators were judged as defects. Note that when the insides of the piezoelectric resonators judged as defects were visually observed, the occurrence of cracks could be confirmed.

The rate (%) of occurrence of defects is shown in Table 2.

As shown in Table 2, the defect rate of the piezoelectric resonators tested in Example 3 was less than 3 percent. Thus, as an overall judgment, the resonators used in Example 3 were determined to be good.

TABLE 2

| | Substrate thickness (mm) | Frequency band (MHz) | Trowel tip width (mm) | Area S1 ($mm^2$) | Rate of occurrence of defects (%) | Overall judgement |
|---|---|---|---|---|---|---|
| Comp. Ex. 3 | 0.35 | 3 | 2.5 | 1.7 | 20 | Poor |
| Comp. Ex. 4 | 0.35 | 3 | 3.0 | 2.1 | 19 | Poor |
| Comp. Ex. 5 | 0.35 | 3 | 3.5 | 2.4 | 18 | Poor |
| Ex. 3 | 0.35 | 3 | 4.0 | 2.7 | 2 | Good |
| Ex. 4 | 0.35 | 3 | 4.5 | 3.0 | 2 | Good |
| Ex. 5 | 0.35 | 3 | 5.0 | 3.4 | 3 | Good |
| Comp. Ex. 6 | 0.35 | 3 | 5.5 | 3.6 | 25 | Poor |
| Comp. Ex. 7 | 0.31 | 4 | 2.5 | 1.7 | 20 | Poor |
| Comp. Ex. 8 | 0.31 | 4 | 3.0 | 2.1 | 15 | Poor |
| Ex. 6 | 0.31 | 4 | 3.5 | 2.4 | 3 | Good |
| Ex. 7 | 0.31 | 4 | 4.0 | 2.7 | 3 | Good |
| Ex. 8 | 0.31 | 4 | 4.5 | 3.0 | 2 | Good |
| Comp. Ex. 9 | 0.31 | 4 | 5.0 | 3.4 | 21 | Poor |
| Comp. Ex. 10 | 0.31 | 4 | 5.5 | 3.7 | 17 | Poor |
| Comp. Ex. 11 | 0.25 | 5 | 2.5 | 1.7 | 20 | Poor |
| Ex. 9 | 0.25 | 5 | 3.0 | 2.1 | 2 | Good |
| Ex. 10 | 0.25 | 5 | 3.5 | 2.4 | 3 | Good |
| Ex. 11 | 0.25 | 5 | 4.0 | 2.7 | 3 | Good |
| Comp. Ex. 12 | 0.25 | 5 | 4.5 | 3.1 | 14 | Poor |
| Comp. Ex. 13 | 0.25 | 5 | 5.0 | 3.4 | 14 | Poor |
| Comp. Ex. 14 | 0.25 | 5 | 5.5 | 3.7 | 17 | Poor |
| Comp. Ex. 15 | 0.21 | 6 | 2.5 | 1.8 | 20 | Poor |
| Ex. 12 | 0.21 | 6 | 3.0 | 2.1 | 2 | Good |
| Ex. 13 | 0.21 | 6 | 3.5 | 2.4 | 2 | Good |
| Ex. 14 | 0.21 | 6 | 4.0 | 2.7 | 3 | Good |
| Comp. Ex. 16 | 0.21 | 6 | 4.5 | 3.1 | 16 | Poor |
| Comp. Ex. 17 | 0.21 | 6 | 5.0 | 3.4 | 18 | Poor |
| Comp. Ex. 18 | 0.21 | 6 | 5.5 | 3.7 | 18 | Poor |

EXAMPLE 4

In Example 4, the procedure outlined in Example 3 was used to fabricate 200 piezoelectric resonators. However, in Example 4, the trowel tip width W4 shown in FIG. 6 was 4.5 mm and the area S1 coated was 3.0 $mm^2$. Once the piezoelectric resonators were fabricated, the defect rate of the piezoelectric resonators was measured as outlined in Example 3.

As shown in Table 2, the defect rate of the piezoelectric resonators tested in Example 4 was less than 3 percent. Thus, as an overall judgment, the resonators used in Example 4 were determined to be good.

EXAMPLE 5

In Example 5, the procedure outlined in Example 3 was used to fabricate 200 piezoelectric resonators. However, in Example 5, the trowel tip width W4 shown in FIG. 6 was 5.0 mm and the area S1 coated was 3.4 $mm^2$. Once the piezoelectric resonators were fabricated, the defect rate of the piezoelectric resonators was measured as outlined in Example 3.

As shown in Table 2, the defect rate of the piezoelectric resonators tested in Example 5 was not more than 3 percent. Thus, as an overall judgment, the resonators used in Example 5 were determined to be good.

COMPARATIVE EXAMPLE 3

In Comparative Example 3, the procedure outlined in Example 3 was used once again to fabricate 200 piezoelectric resonators. However, in Comparative Example 3, the trowel tip width W4 shown in FIG. 6 was 2.5 mm and the area S1 coated was 1.7 $mm^2$. Once the piezoelectric resonators were fabricated, the defect rate of the piezoelectric resonators was measured as outlined in Example 3.

As shown in Table 2, the defect rate of the piezoelectric resonators tested in Comparative Example 3 was more than 20 percent. Thus, as an overall judgment, the piezoelectric resonators used in Comparative Example 3 were determined to be poor.

COMPARATIVE EXAMPLE 4

In Comparative Example 4, the procedure outlined in Example 3 was used to fabricate 200 piezoelectric resonators. However, in Comparative Example 4, the trowel tip width W4 shown in FIG. 6 was 3.0 mm and the area S1 coated was 2.1 mm$^2$. Once the piezoelectric resonators were fabricated, the defect rate of the piezoelectric resonators was measured as outlined in Example 3.

As shown in Table 2, the defect rate of the piezoelectric resonators tested in Comparative Example 4 was more than 19 percent. Thus, as an overall judgment, the piezoelectric resonators used in Comparative Example 4 were determined to be poor.

COMPARATIVE EXAMPLE 5

In Comparative Example 5, the procedure outlined in Example 3 was used to fabricate 200 piezoelectric resonators. However, in Comparative Example 5, the trowel tip width W4 shown in FIG. 6 was 3.5 mm and the area S1 coated was 2.4 mm$^2$. Once the piezoelectric resonators were fabricated, the defect rate of the piezoelectric resonators was measured as outlined in Example 3.

As shown in Table 2, the defect rate of the piezoelectric resonators tested in Comparative Example 5 was more than 18 percent. Thus, as an overall judgment, the piezoelectric resonators used in Comparative Example 5 were determined to be poor.

COMPARATIVE EXAMPLE 6

In Comparative Example 6, the procedure outlined in Example 3 was used to fabricate 200 piezoelectric resonators. However, in Comparative Example 6, the trowel tip width W4 shown in FIG. 6 was 5.5 mm and the area S1 coated was 3.6 mm$^2$. Once the piezoelectric resonators were fabricated, the defect rate of the piezoelectric resonators was measured as outlined in Example 3.

As shown in Table 2, the defect rate of the piezoelectric resonators tested in Comparative Example 6 was more than 25 percent. Thus, as an overall judgment, the piezoelectric resonators used in Comparative Example 6 were determined to be poor.

EXAMPLE 6

In Example 6, the procedure outlined in Example 3 was used to fabricate 200 piezoelectric resonators. However, in Example 6, the capacity across the external electrodes 16 in the capacitor 2 was 15 pF and the thickness of piezoelectric substrate 11 was 0.31 mm. Thus, the resonance frequency of the piezoelectric resonators was 4 MHz. Additionally, the trowel tip width W4 shown in FIG. 6 was 3.5 mm and the area S1 coated was 2.4 mm$^2$. Once the piezoelectric resonators were fabricated, the defect rate of the piezoelectric resonators was measured as outlined in Example 3. Note that in Example 6, resonators with observed wave form distortion when measuring the impedance characteristic and resonators not giving a resonance frequency characteristic within 4 MHz±20 kHz were determined to be defective.

As shown in Table 2, the defect rate of the piezoelectric resonators tested in Example 6 was not more than 3 percent. Thus, as an overall judgment, the piezoelectric resonators used in Example 6 were determined to be good.

EXAMPLE 7

In Example 7, the procedure outlined in Example 6 was used to fabricate 200 piezoelectric resonators. However, in Example 7 the trowel tip width W4 shown in FIG. 6 was 4.0 mm and the area S1 coated was 2.7 mm$^2$. Once the piezoelectric resonators were fabricated, the defect rate of the piezoelectric resonators was measured as outlined in Example 6.

As shown in Table 2, the defect rate of the piezoelectric resonators tested in Example 7 was not more than 3 percent. Thus, as an overall judgment, the piezoelectric resonators used in Example 7 were determined to be good.

EXAMPLE 8

In Example 8, the procedure outlined in Example 6 was used to fabricate 200 piezoelectric resonators. However, in Example 8, the trowel tip width W4 shown in FIG. 6 was 4.5 mm and the area S1 coated was 3.0 mm$^2$. Once the piezoelectric resonators were fabricated, the defect rate of the piezoelectric resonators was measured as outlined in Example 6.

As shown in Table 2, the defect rate of the piezoelectric resonators tested in Example 8 was not more than 3 percent. Thus, as an overall judgment, the piezoelectric resonators used in Example 8 were determined to be good.

COMPARATIVE EXAMPLE 7

In Comparative Example 7, the procedure outlined in Example 6 was used to fabricate 200 piezoelectric resonators. However, in Comparative Example 7, the trowel tip width W4 shown in FIG. 6 was 2.5 mm and the area S1 coated was 1.7 mm$^2$. Once the piezoelectric resonators were fabricated, the defect rate of the piezoelectric resonators was measured as outlined in Example 6.

As shown in Table 2, the defect rate of the piezoelectric resonators tested in Comparative Example 7 was more than 20 percent. Thus, as an overall judgment, the piezoelectric resonators used in Comparative Example 7 were determined to be poor.

COMPARATIVE EXAMPLE 8

In Comparative Example 8, the procedure outlined in Example 6 was used to fabricate 200 piezoelectric resonators. However, in Comparative Example 8, the trowel tip width W4 shown in FIG. 6 was 3.0 mm and the area S1 coated was 2.1 mm$^2$. Once the piezoelectric resonators were fabricated, the defect rate of the piezoelectric resonators was measured as outlined in Example 6.

As shown in Table 2, the defect rate of the piezoelectric resonators tested in Comparative Example 8 was more than 15 percent. Thus, as an overall judgment, the piezoelectric resonators used in Comparative Example 8 were determined to be poor.

COMPARATIVE EXAMPLE 9

In Comparative Example 9, the procedure outlined in Example 6 was used to fabricate 200 piezoelectric resonators. However, in Comparative Example 9, the trowel tip width W4 shown in FIG. 6 was 5.0 mm and the area S1 coated was 3.4 mm². Once the piezoelectric resonators were fabricated, the defect rate of the piezoelectric resonators was measured as outlined in Example 6.

As shown in Table 2, the defect rate of the piezoelectric resonators tested in Comparative Example 9 was more than 21 percent. Thus, as an overall judgment, the piezoelectric resonators used in Comparative Example 9 were determined to be poor.

COMPARATIVE EXAMPLE 10

In Comparative Example 10, the procedure outlined in Example 6 was used to fabricate 200 piezoelectric resonators. However, in Comparative Example 10, the trowel tip width W4 shown in FIG. 6 was 5.5 mm and the area S1 coated was 3.7 mm². Once the piezoelectric resonators were fabricated, the defect rate of the piezoelectric resonators was measured as outlined in Example 6.

As shown in Table 2, the defect rate of the piezoelectric resonators tested in Comparative Example 10 was more than 17 percent. Thus, as an overall judgment, the piezoelectric resonators used in Comparative Example 10 were determined to be poor.

EXAMPLE 9

In Example 9, the procedure outlined in Example 3 was used to fabricate 200 piezoelectric resonators. However, in Example 9, the capacity across the external electrodes 16 in the capacitor 2 was 15 pF and the thickness of piezoelectric substrate 11 was 0.25 mm. Thus, the resonance frequency of the piezoelectric resonators was 5 MHz. Additionally, the trowel tip width W4 shown in FIG. 6 was 3.0 mm and the area S1 coated was 2.1 mm². Once the piezoelectric resonators were fabricated, the defect rate of the piezoelectric resonators was measured as outlined in Example 3. Note that in Example 9, resonators with observed wave form distortion when measuring the impedance characteristic and resonators not giving a resonance frequency characteristic within 5 MHz±25 kHz were determined to be defective.

As shown in Table 2, the defect rate of the piezoelectric resonators tested in Example 9 was not more than 3 percent. Thus, as an overall judgment, the piezoelectric resonators used in Example 9 were determined to be good.

EXAMPLE 10

In Example 10, the procedure outlined in Example 9 was used to fabricate 200 piezoelectric resonators. However, in Example 10, the trowel tip width W4 shown in FIG. 6 was 3.5 mm and the area S1 coated was 2.4 mm². Once the piezoelectric resonators were fabricated, the defect rate of the piezoelectric resonators was measured as outlined in Example 9.

As shown in Table 2, the defect rate of the piezoelectric resonators tested in Example 10 was not more than 3 percent. Thus, as an overall judgment, the piezoelectric resonators used in Example 10 were determined to be good.

EXAMPLE 11

In Example 11, the procedure outlined in Example 9 was used to fabricate 200 piezoelectric resonators. However, in Example 11, the trowel tip width W4 shown in FIG. 6 was 4.0 mm and the area S1 coated was 2.7 mm². Once the piezoelectric resonators were fabricated, the defect rate of the piezoelectric resonators was measured as outlined in Example 9.

As shown in Table 2, the defect rate of the piezoelectric resonators tested in Example 11 was not more than 3 percent. Thus, as an overall judgment, the piezoelectric resonators used in Example 11 were determined to be good.

COMPARATIVE EXAMPLE 11

In Comparative Example 11, the procedure outlined in Example 9 was used to fabricate 200 piezoelectric resonators. However, in Comparative Example 11, the trowel tip width W4 shown in FIG. 6 was 2.5 mm and the area S1 coated was 1.7 mm². Once the piezoelectric resonators were fabricated, the defect rate of the piezoelectric resonators was measured as outlined in Example 9.

As shown in Table 2, the defect rate of the piezoelectric resonators tested in Comparative Example 11 was more than 20 percent. Thus, as an overall judgment, the piezoelectric resonators used in Comparative Example 11 were determined to be poor.

COMPARATIVE EXAMPLE 12

In Comparative Example 12, the procedure outlined in Example 9 was used to fabricate 200 piezoelectric resonators. However, in Comparative Example 12, the trowel tip width W4 shown in FIG. 6 was 4.5 mm and the area S1 coated was 3.1 mm². Once the piezoelectric resonators were fabricated, the defect rate of the piezoelectric resonators was measured as outlined in Example 9.

As shown in Table 2, the defect rate of the piezoelectric resonators tested in Comparative Example 12 was more than 14 percent. Thus, as an overall judgment, the piezoelectric resonators used in Comparative Example 12 were determined to be poor.

COMPARATIVE EXAMPLE 13

In Comparative Example 13, the procedure outlined in Example 9 was used to fabricate 200 piezoelectric resonators. However, in Comparative Example 13, the trowel tip width W4 shown in FIG. 6 was 5.0 mm and the area S1 coated was 3.4 mm². Once the piezoelectric resonators were fabricated, the defect rate of the piezoelectric resonators was measured as outlined in Example 9.

As shown in Table 2, the defect rate of the piezoelectric resonators tested in Comparative Example 13 was more than 14 percent. Thus, as an overall judgment, the piezoelectric resonators used in Comparative Example 13 were determined to be poor.

COMPARATIVE EXAMPLE 14

In Comparative Example 14, the procedure outlined in Example 6 was used to fabricate 200 piezoelectric resonators. However, in Comparative Example 14, the trowel tip width W4 shown in FIG. 6 was 5.5 mm and the area S1 coated was 3.7 mm². Once the piezoelectric resonators were fabricated, the defect rate of the piezoelectric resonators was measured as outlined in Example 9.

As shown in Table 2, the defect rate of the piezoelectric resonators tested in Comparative Example 14 was more than 17 percent. Thus, as an overall judgment, the piezoelectric resonators used in Comparative Example 14 were determined to be poor.

EXAMPLE 12

In Example 12, the procedure outlined in Example 3 was used to fabricate 200 piezoelectric resonators. However, in Example 12, the capacity across the external electrodes 16 in the capacitor 2 was 15 pF and the thickness of piezoelectric substrate 11 was 0.21 mm. Thus, the resonance frequency of the piezoelectric resonators was 6 MHz. Additionally, the trowel tip width W4 shown in FIG. 6 was 3.0 mm and the area S1 coated was 2.1 mm². Once the piezoelectric resonators were fabricated, the defect rate of the piezoelectric resonators was measured as outlined in Example 3. Note that in Example 12, resonators with observed wave form distortion when measuring the impedance characteristic and resonators not giving a resonance frequency characteristic within 6 MHz±20 kHz were determined to be defective.

As shown in Table 2, the defect rate of the piezoelectric resonators tested in Example 12 was not more than 3 percent. Thus, as an overall judgment, the piezoelectric resonators used in Example 12 were determined to be good.

EXAMPLE 13

In Example 13, the procedure outlined in Example 12 was used to fabricate 200 piezoelectric resonators. However, in Example 13, the trowel tip width W4 shown in FIG. 6 was 3.5 mm and the area S1 coated was 2.4 mm². Once the piezoelectric resonators were fabricated, the defect rate of the piezoelectric resonators was measured as outlined in Example 12.

As shown in Table 2, the defect rate of the piezoelectric resonators tested in Example 13 was not more than 3 percent. Thus, as an overall judgment, the piezoelectric resonators used in Example 13 were determined to be good.

EXAMPLE 14

In Example 14, the procedure outlined in Example 9 was used to fabricate 20 piezoelectric resonators. However, in Example 14, the trowel tip width W4 shown in FIG. 6 was 4.0 mm and the area S1 coated was 2.7 mm². Once the piezoelectric resonators were fabricated, the defect rate of the piezoelectric resonators was measured as outlined in Example 9.

As shown in Table 2, the defect rate of the piezoelectric resonators tested in Example 14 was not more than 3 percent. Thus, as an overall judgment, the piezoelectric resonators used in Example 14 were determined to be good.

COMPARATIVE EXAMPLE 15

In Comparative Example 15, the procedure outlined in Example 12 was used to fabricate 200 piezoelectric resonators. However, in Comparative Example 15, the trowel tip width W4 shown in FIG. 6 was 2.5 mm and the area S1 coated was 1.8 mm². Once the piezoelectric resonators were fabricated, the defect rate of the piezoelectric resonators was measured as outlined in Example 12.

As shown in Table 2, the defect rate of the piezoelectric resonators tested in Comparative Example 15 was more than 20 percent. Thus, as an overall judgment, the piezoelectric resonators used in Comparative Example 15 were determined to be poor.

COMPARATIVE EXAMPLE 16

In Comparative Example 16, the procedure outlined in Example 12 was used to fabricate 200 piezoelectric resonators. However, in Comparative Example 16, the trowel tip width W4 shown in FIG. 6 was 4.5 mm and the area S1 coated was 3.1 mm². Once the piezoelectric resonators were fabricated, the defect rate of the piezoelectric resonators was measured as outlined in Example 12.

As shown in Table 2, the defect rate of the piezoelectric resonators tested in Comparative Example 16 was more than 16 percent. Thus, as an overall judgment, the piezoelectric resonators used in Comparative Example 16 were determined to be poor.

COMPARATIVE EXAMPLE 17

In Comparative Example 17, the procedure outlined in Example 12 was used to fabricate 200 piezoelectric resonators. However, in Comparative Example 17, the trowel tip width W4 shown in FIG. 6 was 5.0 mm and the area S1 coated was 3.4 mm². Once the piezoelectric resonators were fabricated, the defect rate of the piezoelectric resonators was measured as outlined in Example 12.

As shown in Table 2, the defect rate of the piezoelectric resonators tested in Comparative Example 17 was more than 18 percent. Thus, as an overall judgment, the piezoelectric resonators used in Comparative Example 17 were determined to be poor.

COMPARATIVE EXAMPLE 18

In Comparative Example 18, the procedure outlined in Example 12 was used to fabricate 200 piezoelectric resonators. However, in Comparative Example 18, the trowel tip width W4 shown in FIG. 6 was 5.5 mm and the area S1 coated was 3.7 mm². Once the piezoelectric resonators were fabricated, the defect rate of the piezoelectric resonators was measured as outlined in Example 12.

As shown in Table 2, the defect rate of the piezoelectric resonators tested in Comparative Example 18 was more than 18 percent. Thus, as an overall judgment, the piezoelectric resonators used in Comparative Example 18 were determined to be poor.

Evaluation 2

As shown in Table 2, as will be understood by comparing Examples 3 to 14 with Comparative Examples 3 to 18, by making the area S1 of the surface of the piezoelectric element 1 contacting the vibrating space 20 3.0±0.4 mm² when the frequency band is 3 MHz, making the area S1 2.7±0.4 mm² when the frequency band is 4 MHz, and making the area S1 2.4±0.4 mm² when the frequency band is 5 to 6 MHz, it is possible to suppress the occurrence of cracks without impairing the resonance characteristics. That is, by reducing the area S1 of the piezoelectric element 1 contacting the vibrating space 20 as the frequency band becomes higher, it is possible to suppress the occurrence of cracks without impairing the resonance characteristics.

What is claimed is:

1. A resonator comprising:

a piezoelectric element;

a lead terminal comprised of an electro-conductive wire material formed by press working with a tapered V shaped or trapezoidal receiving groove for holding an end of the piezoelectric element, the cross-sectional shape of the wire material constituting the lead terminal being substantially circular at the portion not formned with the tapered V shaped or trapezoidal receiving groove and the tapered V shaped or trapezoidal receiving groove having an open portion, with a cross section wider than the thickness of the end of the piezoelectric element, and a pair of inclined straight line side walls extending from a top of the groove to a bottom of the groove; and a capacitor connected to the outer circumference of the top end of the lead terminal in a state with the end of the piezoelectric element held in the receiving groove of the lead terminal so as to constitute a resonance circuit together with the piezoelectric element.

2. The resonator according to claim 1, wherein the tapered V-shaped or trapezoidal receiving groove has a bottom wall with a cross-section more narrow than the thickness of the end of the piezoelectric element.

3. The resonator according to claim 1, wherein an external electrode formed at the surface of the piezoelectric element is electrically connected to the lead terminal through solder in the receiving groove.

4. The resonator according to claim 1, wherein the tapered receiving groove is formed at a top end of the lead terminal along the longitudinal direction of the lead terminal wherein a length of the tapered receiving groove is at least equal to the width of the piezoelectric element.

5. The resonator according to claim 1, wherein a bent portion is formed in the lead terminal.

6. The resonator according to claim 1, wherein a difference of a coefficient of heat expansion of a piezoelectric ceramic constituting the piezoelectric element and a coefficient of heat expansion of a dielectric ceramic constituting the capacitor is not more than 5 ppm/° C.

7. The resonator according to claim 6, wherein the piezoelectric ceramic is a three-component-based zirconia-lead titanate-based ceramic and the dielectric ceramic is a lead-based ceramic.

8. The resonator according to claim 1, further comprising a sealing resin portion covering the piezoelectric element, the capacitor, and the top ends of the lead terminals so as to form a vibrating space around a vibrating section of the piezoelectric element.

9. The resonator according to claim 8, wherein the area of the surface of the piezoelectric element within the vibrating space is in a predetermined relationship with the frequency band of the piezoelectric element.

10. The resonator according to claim 9, wherein when the frequency band of the piezoelectric element is 3 MHz, the area of the surface of the piezoelectric element within the vibrating space is $3.0\pm0.4$ mm$^2$.

11. The resonator according to claim 9, wherein when the frequency band of the piezoelectric element is 4 MHz, the area of the surface of the piezoelectric element within the vibrating space is $2.7\pm0.4$ mm$^2$.

12. The resonator according to claim 9, wherein when the frequency band of the piezoelectric element is 5 to 6 MHz, the area of the surface of the piezoelectric element within the vibrating space is $2.4\pm0.4$ mm$^2$.

13. A resonator comprising:

a piezoelectric element;

a lead terminal comprised of an electro-conductive wire material for holding an end of the piezoelectric element, formed by press working with a tapered V-shaped or trapezoidal receiving groove for holding an end of the piezoelectric element, the cross-sectional shape of the wire material constituting the lead terminal being substantially circular at the portion not formed with the tapered V-shaped or trapezoidal receiving groove and the tapered V-shaped or trapezoidal receiving groove having an open portion, with a cross section wider than the thickness of the end of the piezoelectric element, and a pair of inclined straight line side walls extending from a top of the groove to a bottom of the groove; and a capacitor connected to the top end of the lead terminal in a state with the end of the piezoelectric element held by the lead terminal so as to constitute a resonance circuit together with the piezoelectric element, wherein a difference of a coefficient of heat expansion of a piezoelectric ceramic constituting the piezoelectric element and a coefficient of heat expansion of a dielectric ceramic constituting the capacitor is not more than 5 ppm/° C.

14. The resonator according to claim 13, wherein the piezoelectric ceramic is a three-component based zirconia-lead titanate based ceramic and the dielectric ceramic is a lead-based ceramic.

15. A piezoelectric resonance device comprising:

a tapered V-shaped or trapezoidal receiving groove having an open portion and a pair of inclined straight line side walls extending from a top of the groove to a bottom of the groove;

a piezoelectric element having ends located within the receiving groove, the groove having a cross section wider than the thickness of the end of the piezoelectric element; and a sealing resin portion for covering the piezoelectric element so that a vibrating space is formed around a vibrating section of the piezoelectric element, wherein the area of the surface of the piezoelectric element within the vibrating space is in a predetermined relation with the frequency band of the piezoelectric element.

16. The piezoelectric resonance device according to claim 15, wherein when the frequency band of the piezoelectric element is 3 MHz, the area of the surface of the piezoelectric element within the vibrating space is $3.0\pm0.4$ mm$^2$.

17. The piezoelectric resonance device according to claim 15, wherein when the frequency band of the piezoelectric element is 4 MHz, the area of the surface of the piezoelectric element within the vibrating space is $2.7\pm0.4$ mm$^2$.

18. The piezoelectric resonance device according to claim 15, wherein when the frequency band of the piezoelectric element is 5 to 6 MHz, the area of the surface of the piezoelectric element within the vibrating space is $2.4\pm0.4$ mm.

* * * * *